(12) United States Patent
Coene et al.

(10) Patent No.: US 9,201,311 B2
(45) Date of Patent: Dec. 1, 2015

(54) METHODS AND PATTERNING DEVICES FOR MEASURING PHASE ABERRATION

(75) Inventors: Willem Marie Julia Marcel Coene, Geldrop (NL); Sven Van Haver, Nootdrop (NL)

(73) Assignee: ASML Netherlands B.V., Veldhoven (NL)

( * ) Notice: Subject to any disclaimer, the term of this patent is extended or adjusted under 35 U.S.C. 154(b) by 691 days.

(21) Appl. No.: 13/533,082

(22) Filed: Jun. 26, 2012

(65) Prior Publication Data

US 2013/0010306 A1    Jan. 10, 2013

Related U.S. Application Data

(60) Provisional application No. 61/505,683, filed on Jul. 8, 2011.

(51) Int. Cl.

| | | |
|---|---|---|
| *G03F 7/20* | (2006.01) | |
| *G01B 15/04* | (2006.01) | |
| *G01B 11/24* | (2006.01) | |
| *G03F 1/26* | (2012.01) | |
| *G03F 1/34* | (2012.01) | |

(52) U.S. Cl.
CPC ............ *G03F 7/70633* (2013.01); *G01B 11/24* (2013.01); *G01B 15/04* (2013.01); *G03F 1/26* (2013.01); *G03F 1/34* (2013.01); *G03F 7/706* (2013.01)

(58) Field of Classification Search
CPC .......... G01B 11/24; G01B 15/04; G03F 1/26; G03F 1/34; G03F 7/706; G03F 7/70633; G03F 1/44; G03F 7/70291
See application file for complete search history.

(56) References Cited

U.S. PATENT DOCUMENTS

| | | | | |
|---|---|---|---|---|
| 7,426,017 | B2 * | 9/2008 | Kondo | 355/55 |
| 7,678,513 | B2 * | 3/2010 | Nomura | 430/5 |
| 2002/0021434 | A1 * | 2/2002 | Nomura et al. | 355/55 |
| 2002/0159049 | A1 * | 10/2002 | Sato et al. | 356/121 |
| 2006/0066855 | A1 | 3/2006 | Boef et al. | |
| 2006/0197951 | A1 * | 9/2006 | Frommer et al. | 356/401 |
| 2010/0201963 | A1 | 8/2010 | Cramer et al. | |
| 2010/0328655 | A1 | 12/2010 | Den Boef | |

FOREIGN PATENT DOCUMENTS

EP    1 628 164 A2    2/2006

OTHER PUBLICATIONS

Nomura, H., "Accurate Measurement of Spherical and Astigmatic Abberations by a Phase Shift Grating Reticle," Japenese Journal of Applied Physics, vol. 40, Part 1, No. 11, Nov. 2001; pp. 6316-6322.

* cited by examiner

*Primary Examiner* — Steven H Whitesell Gordon
(74) *Attorney, Agent, or Firm* — Sterne, Kessler, Goldstein & Fox P.L.L.C.

(57) ABSTRACT

A method of measuring a phase difference between two regions in an aberration function: Reference structures are produced on a substrate using illumination that minimizes effects of phase aberration. A grating is produced on the substrate using a phase-shift grating reticle to produce, in the exit pupil, a pair of diffracted non-zero orders, while forbidding other diffracted orders and produces interference fringes formed by interference between the pair. The interference contributes to a first grating on the substrate. Overlay error is measured between the grating and the reference structure using diffraction-based or image-based overlay measurements. A phase aberration function for the exit pupil of the lithographic apparatus can then be determined from the measured overlay errors.

41 Claims, 15 Drawing Sheets

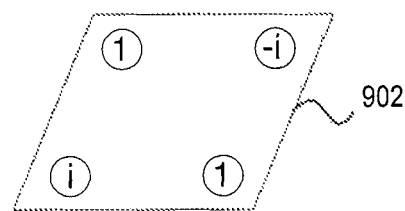
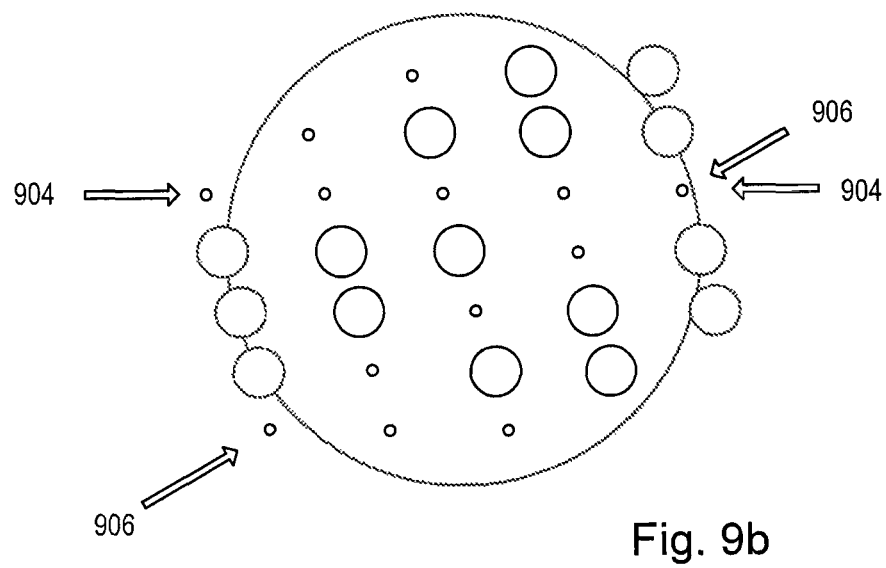
Fig. 9a
Fig. 9b

US 9,201,311 B2

METHODS AND PATTERNING DEVICES FOR MEASURING PHASE ABERRATION

CROSS REFERENCE TO RELATED APPLICATIONS

This application claims the benefit under 35 U.S.C. §119 (e) to U.S. Provisional Patent Application No. 61/505,683, filed Jul. 8, 2011, which is incorporated by reference herein in its entirety.

BACKGROUND

1. Field of the Present Invention

The present invention relates to methods and patterning devices for measuring a phase difference between two regions in an aberration function of a lithographic apparatus usable, for example, in the manufacture of devices by lithographic techniques.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

SUMMARY

It would be desirable to sample towards the outer edges of the exit pupil of the lithographic apparatus with fringes having a pitch compatible with DBO measurements.

It would be desirable to enlarge the available area in the exit pupil of the lithographic apparatus towards the origin, for aberration sampling.

According to a first embodiment of the present invention, there is provided a method of measuring a phase difference between two regions in an aberration function of a lithographic apparatus, the method comprising the steps a) using the lithographic apparatus to produce a first reference structure on a substrate, b) using the lithographic apparatus to produce a first grating on the substrate by illuminating a reticle with radiation, the reticle comprising an area with a phase-shift grating periodic in first and second directions and configured to produce in the exit pupil of the lithographic apparatus a pair of diffracted orders of the radiation other than the zeroth order while forbidding any other diffracted orders of the radiation in the exit pupil and to produce interference fringes formed by interference between the pair of diffracted orders of the radiation, the interference fringes contributing to the definition of the first grating on the substrate; and c) measuring the overlay error between the first grating and the first reference structure.

According to another embodiment of the present invention, there is provided a method of measuring a phase difference between two regions in an aberration function of a lithographic apparatus, the method comprising the steps a) using the lithographic apparatus to produce a second reference structure on a substrate, b) using the lithographic apparatus to produce a second grating on the substrate by illuminating a reticle with radiation, the reticle comprising an area with a phase-shift grating configured to produce in the exit pupil of the lithographic apparatus an allowed diffracted first order of the radiation while forbidding diffraction of another first order and both second orders of the radiation in the exit pupil and to produce interference fringes formed by interference between a zeroth order of the radiation and the allowed diffracted first order of the radiation, the interference fringes defining the second grating on the substrate; and c) measuring the overlay error between the second grating and the second reference structure.

According to a further embodiment of the present invention, there is provided a method of measuring a phase difference between two regions in an aberration function of a lithographic apparatus, the method comprising the steps a) using the lithographic apparatus to produce a first reference structure on a substrate; b) using the lithographic apparatus to produce a second reference structure on a substrate; c) using the lithographic apparatus to produce a first grating on the substrate by illuminating a reticle with radiation, the reticle comprising an area with a phase-shift grating periodic in first and second directions and configured to produce in the exit pupil of the lithographic apparatus a pair of diffracted orders of the radiation other than the zeroth order while forbidding any other diffracted orders of the radiation in the exit pupil and to produce interference fringes formed by interference between the pair of diffracted orders of the radiation, the interference fringes contributing to the definition of the first grating on the substrate; and d) using the lithographic apparatus to produce a second grating on the substrate by illuminating the reticle with radiation, the reticle comprising an area with a phase-shift grating configured to produce in the exit pupil of the lithographic apparatus an allowed diffracted first order of the radiation while forbidding diffraction of another first order and both second orders of the radiation in the exit pupil and to produce interference fringes formed by interference between a zeroth order of the radiation and the allowed diffracted first order of the radiation, the interference fringes defining the second grating on the substrate; e) measuring the overlay error between the first grating and the first reference structure, and f) measuring the overlay error between the second grating and the second reference structure.

According to a still further embodiment of the present invention, there is provided a patterning device for use in measuring a phase difference between two regions in an aberration function of a lithographic apparatus by using the lithographic apparatus to produce a first grating on a substrate by illuminating the patterning device with radiation, the patterning device comprising an area with a phase-shift grating periodic in first and second directions and configured to produce in the exit pupil of the lithographic apparatus a pair of diffracted orders of the radiation other than the zeroth order while forbidding any other diffracted orders of the radiation in the exit pupil and to produce interference fringes formed by interference between the pair of diffracted orders of the radiation, the interference fringes contributing to the definition of the first grating on a substrate.

According to yet another embodiment of the present invention, there is provided a patterning device for use in measuring a phase difference between two regions in an aberration function of a lithographic apparatus by using the lithographic apparatus to produce a second grating on a substrate by illuminating the patterning device with radiation, the patterning device comprising an area with a phase-shift grating configured to produce in the exit pupil of the lithographic apparatus an allowed diffracted first order of the radiation while forbidding diffraction of another first order and both second orders of the radiation in the exit pupil and to produce interference fringes formed by interference between a zeroth order of the radiation and the allowed diffracted first order of the radiation, the interference fringes defining the second grating on the substrate.

According to a still further aspect of the present invention, there is provided a patterning device for use in measuring a phase difference between two regions in an aberration function of a lithographic apparatus by using the lithographic apparatus to produce a first grating and a second grating on a substrate by illuminating the patterning device with radiation, the patterning device comprising:—a first area with a phase-shift grating periodic in first and second directions and configured to produce in the exit pupil of the lithographic apparatus a pair of diffracted orders of the radiation other than the zeroth order while forbidding any other diffracted orders of the radiation in the exit pupil and to produce interference fringes formed by interference between the pair of diffracted orders of the radiation, the interference fringes contributing to the definition of the first grating on a substrate; and—a second area with a phase-shift grating configured to produce in the exit pupil of the lithographic apparatus an allowed diffracted first order of the radiation while forbidding diffraction of another first order and both second orders of the radiation in the exit pupil and to produce interference fringes formed by interference between a zeroth order of the radiation and the allowed diffracted first order of the radiation, the interference fringes defining the second grating on the substrate.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

FIG. 9a illustrates a 2-D PSG with an oblique unit cell in accordance with an embodiment of the present invention and a FIG. 9b illustrates a corresponding diffraction pattern.

Figure 1:
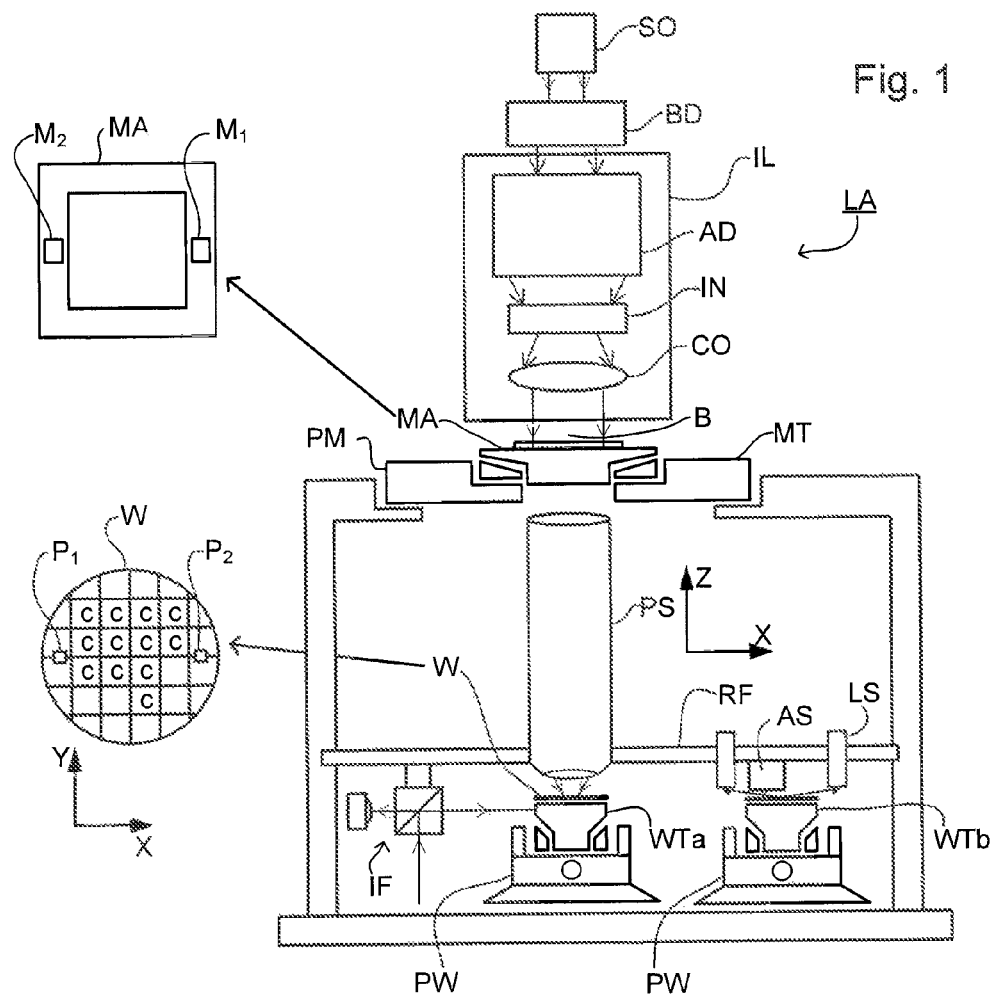
FIG. 1 depicts a lithographic apparatus.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

All references and documents discussed below are incorporated by references herein in their entireties.

Diffraction-based overlay (DBO) is a method of measuring overlay errors using an angularly resolved scatterometer, such as disclosed in US Patent Publications US2006066855 and US20100328655, which are incorporated by reference herein in their entireties. Box-in-box image-based measurements of overlay are also known. DBO measurements use smaller overlay measurement targets than box-in-box, giving a higher sampling density across the measurement area and higher measurement speed.

Imperfections and temperature induced deformations of optical components introduce phase aberrations to an optical system. If an optical system is assumed to be birefringence free, its aberrations can be uniquely described by a non-uniform phase function in the exit pupil. In a semiconductor manufacturing environment it is desirable to determine these aberrations in the optical systems of a lithographic apparatus. The aberrations can then be controlled or compensated for. Furthermore, it is desirable to determine such aberrations based on the examination of printed resist structures.

Overlay measurements have been used to characterize aberrations using a method described by Nomura et al. (H. Nomura, Accurate Measurement of Spherical and Astigmatic Aberrations by a Phase Shift Grating Reticle, Jpn. J. Appl. Phys. Vol. 40 (2001) pp. 6316-6322, from Toshiba Corporation), which is incorporated by reference here in its entirety. Information on the aberration function of an optical system may be obtained via two-beam interference. Two beams interfere under an angle in image space to generate a standing wave pattern. In Fourier space, only two distinct positions in the exit pupil have non-zero transmission. The phase offset between beams is given by the difference in value of the aberration function at the two corresponding pupil positions. A phase offset between beams translates into a lateral pattern shift in image space. This lateral shift can be measured using overlay error measurements. The aberrations are then characterized using such overlay measurements by sampling the phase difference between pairs of points in the exit pupil of the lithographic apparatus. The phase aberration function across the lithographic apparatus exit pupil may then be derived from a sampling scheme in which the phase difference between many pairs of points in the exit pupil is determined.

The method of Nomura et al uses so-called phase-shift gratings (PSGs) at the reticle, with a centered monopole illumination mode in the lithographic apparatus' entrance pupil. These PSGs produce upon transmission through the reticle a zeroth order and only one allowed 1st order diffracted beam (a +1st order for a so-called right-PSG and a −1st order for a so-called left-PSG). Thus, respectively, the −1st or +1st diffraction order is forbidden. This results in a pure two-beam process if 2nd orders lie outside the exit pupil. The zeroth order beam and allowed 1st order beam interfere to form an interference fringe. The fringe shift of the left and right PSGs' images on the wafer are characteristic for the aberration cocktail of the scanner. The fringe shift is measured as an overlay value.

Using a two-beam process one can, in principle, probe the phase difference between any two points in the pupil. By using many different two-beam processes one can collect in this way enough information to reconstruct the aberration function. PSG pitch may be used to control the radial position of the diffracted 1st orders. Rotation of the PSG controls the azimuthal position of the diffracted 1st orders.

For the aberration reconstruction process to be accurate it is important to sample the phase aberration at many points distributed throughout the exit pupil of the lithographic apparatus, particularly at the edges of the exit pupil where the variation of the phase of the aberration function is typically most severe.

Because of the advantages of diffraction based overlay (DBO) measurements mentioned above, it would be advantageous to use DBO measurements to characterize the lithographic apparatus phase aberration. The extra samples that can be collected would lead to a more accurate characterization of the phase aberration function and would allow characterization at a larger number of positions through field.

Note that the constraint of the lithographic apparatus (requirement that higher orders should be outside the pupil) is always present when applying a Nomura like approach based on two-beam interference. The other, scatterometer induced, constraint originates from the use of DBO. Although a different overlay method would not suffer from this constraint, such an other overlay method would of course impose its own, but different, constraint on the overall aberration reconstruction method.

However, there is a problem that prevents using DBO for aberration measurements and achieving characterization across the exit pupil using the Nomura method.

Direct implementation of Nomura's method for aberration measurement using DBO is not possible due to constraints imposed by the optical systems of the scatterometer and of the lithographic apparatus.

Firstly, the scatterometer requires a minimum grating pitch, p, to allow a DBO measurement.

Secondly, the lithographic apparatus imposes a second constraint on the pitch, p, as a pure two-beam interference process is required.

Figure 18:
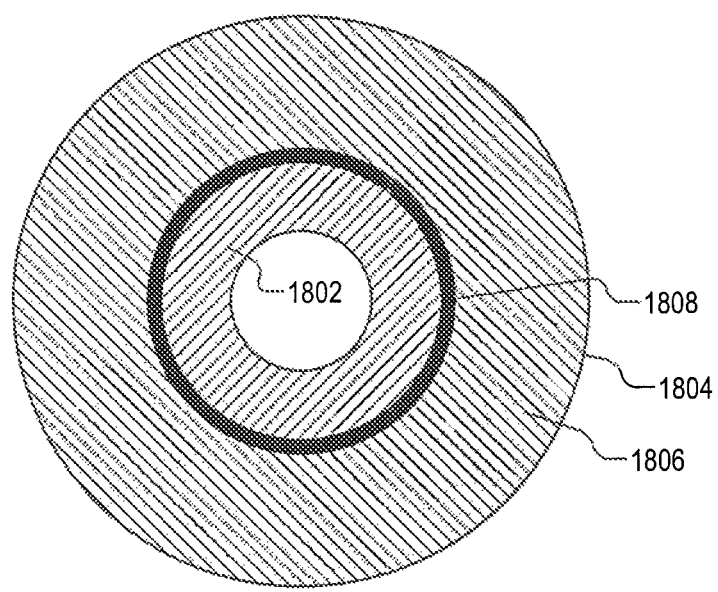
FIG. 18 illustrates the allowed area for aberration sampling in the lithographic apparatus' exit pupil.

Together, both constraints imply that, using Nomura's method with DBO, one can only determine the phase in a very narrow annulus-shaped area of the exit pupil (1808 in FIG. 18). Having phase values available in such a small fraction of the full pupil is clearly insufficient to accurately reconstruct the aberration function.

Figure 5:
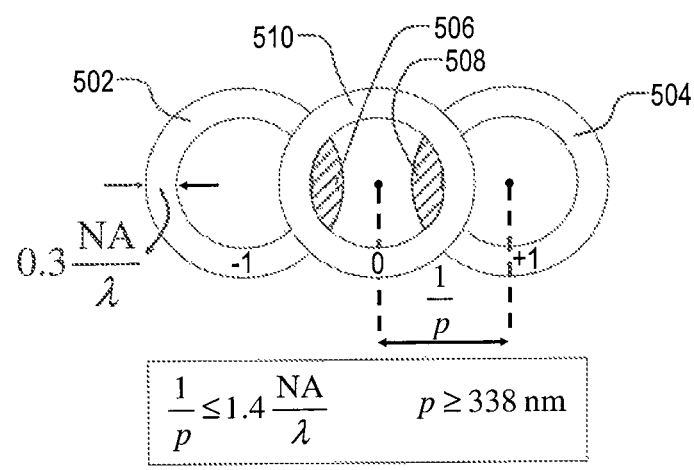
FIG. 5 illustrates a pitch constraint for diffraction-based overlay (DBO) measurements with annular illumination.

FIG. 5 illustrates the first pitch constraint for DBO measurements with annular illumination ($\lambda$=450 nm; NA=0.95; $\sigma$=0.3). Here, $\sigma$ is the proportion of the radius of the scatterometer entrance pupil that is illuminated ($0 \geq \sigma \geq 1$). With reference to FIG. 5, to use a scatterometer for DBO measurements, it is required that the −1 and +1 orders 502 and 504 respectively are both present in the scatterometer exit pupil (defined by the outer edge of annulus 510, not to be confused with the lithographic apparatus exit pupil). This is so that the overlay error can be derived from the asymmetry of the "free" portions of the diffracted −1 and +1 orders, 506 and 508 respectively. "free" here means that the portions do not overlap the zeroth order 510. As the measured grating pitch is reduced, the −1 and +1 orders are spread further apart in the exit pupil. For less than a minimum pitch, the −1 and +1 orders are not present together in the exit pupil, with the effect that overlay measurements cannot be performed. Thus there is a lower limit on the grating pitch for DBO measurements using a scatterometer.

It is also possible to determine the overlay using a scatterometer when no higher orders are present in the pupil, by assessing the asymmetry in the zeroth order only. This would then completely remove this constraint.

Overlay metrology using DBO on a typical angular resolved scatterometer requires, for a typical wavelength $\lambda$ of 450 nm, a minimum grating pitch p of 338 nm to 263 nm for conventional annular illumination ($\sigma$=0.3 to $\sigma$=0.1; FIG. 5 shows by way of example $\sigma$=0.3). An improvement in minimum pitch can be obtained by using quadrant illumination as disclosed in US Patent Publication US2010201963 for which the minimum grating pitch p can be reduced down to 249 nm ($\lambda$=450 nm; NA=0.95).

Figure 6:
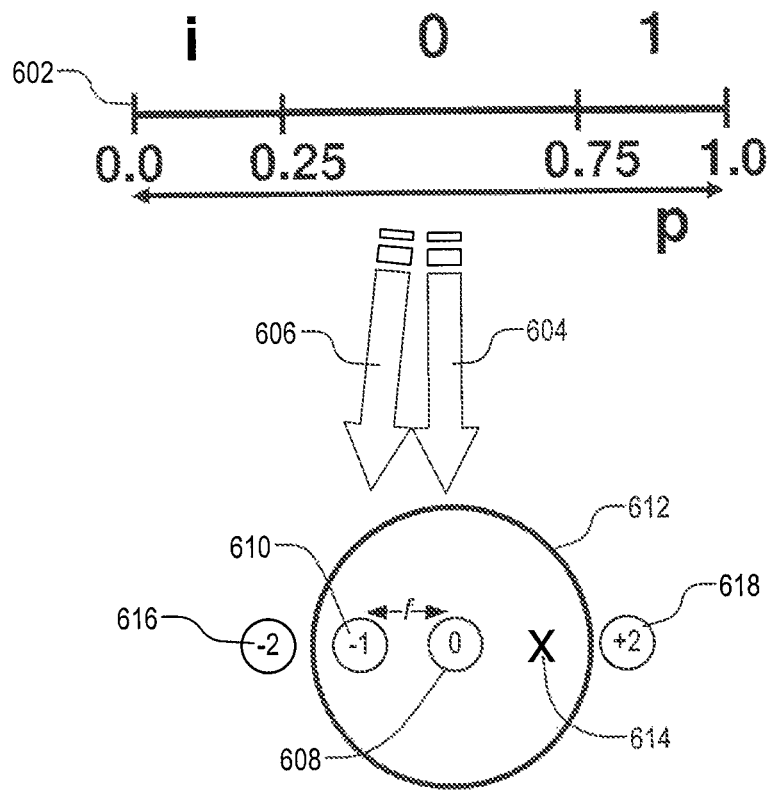
FIG. 6 illustrates a prior art left-phase-shift grating (left-PSG), with the transmission in the 1-D unit cell of the reticle and the resulting diffraction pattern.

FIG. 6 illustrates the second pitch constraint when using a prior art PSG, as described by Nomura. In Nomura's method, the respective transmission of each quarter period in the 1-D left-PSG unit cell 602 of the reticle with pitch p is given by: i, 0, 0, 1. The zeroth order 604 and allowed first order 606 diffracted beams are shown with the respective zeroth order 608 and allowed diffracted first order 610 in the exit pupil 612 of the lithographic apparatus. The forbidden first order is depicted with a cross 614. The second orders 616, 618 are allowed, but should remain outside the exit pupil 612 in order to generate a pure two beam process inside the lithographic apparatus.

The pitch constraint imposed by the DBO measurement ($p \geq 338$ nm) implies that the aberration function can only be sampled up to a maximum fraction f of the scanner's exit pupil 612, where $0 \leq f \leq 1$. The relation $$\frac{1}{p} = f \frac{NA_{LA}}{\lambda_{LA}}$$

where $NA_{LA}$ and $\lambda_{LA}$ are the numerical aperture and illumination wavelength of the lithographic apparatus, leads to a maximum f equal to 0.42 for the case of annular illumination for a typical angularly resolved scatterometer and DBO measurements with $\sigma$=0.3.

The pitch requirement for DBO introduces a disadvantage for its use with Nomura's procedure, in terms of sensitivity: for a centered monopole illumination in the lithographic apparatus, the left-PSG in FIG. 6 leads to an evaluation of the aberration function at a radial distance of 42% (in the annular illumination case) up to 54% (in the quadrant illumination case) of the lithographic apparatus' exit pupil (1808 in FIG. 18). This is an area where most aberrations do not lead to large phase-distortions yet (as confirmed when Zernike polynomials used to characterize the aberration function typically show the largest variations close to the edge of the lithographic apparatus' exit pupil).

In addition, there is another issue related to multiple diffraction orders, which is not due to the DBO constraint but is due to the constraint imposed by the lithographic apparatus. Apart from the intended 1st orders of diffraction 606 (with the right one missing for a left-PSG in FIG. 6), also the 2nd orders of diffraction will be transmitted through the lithographic apparatus' exit pupil, thereby leading to an increased complexity since multiple 2-beam interferences, each with their own aberration sensitivity, will lead to multiple fringes in the resist image at wafer level.

This is a problem using the method of Nomura with overlay measured using DBO; the grating pitch limitation prevents sampling closer to the outer edges of the numerical aperture of the exposure apparatus.

Thus on the one hand, it would be desirable to sample the aberrations of the lithographic apparatus close to the edges of its exit pupil, but this requires small close-to-resolution pitches. On the other hand, a large enough pitch is desired that is still compatible with an angular resolved scatterometer and diffraction based overlay (DBO) measurements.

The characterization of the aberration function can be described using Zernike polynomials. The phase aberration function is determined by fitting Zernike polynomial coefficients to obtain a modeled phase aberration function. For unique Zernike-retrieval, sampling points throughout the exit pupil of the lithographic apparatus are required. While sampling throughout the exit pupil of the lithographic apparatus using DBO measurements, one has to satisfy two pitch constraints (on top of the forbidden diffraction orders that are dictated by the 1-D PSG). Firstly, the pitch should be large enough to make it possible to measure the aberration-induced overlay with an angularly resolved scatterometer, thus the pitch p should satisfy: p>249 nm. Secondly, the pitch should be small enough so that only the zeroth and 1st diffraction orders are present within the lithographic apparatus' exit pupil (that is, higher-orders that are not forbidden by the 1-D PSG must fall outside of the lithographic apparatus' exit pupil).

For Nomura's 1D phase-shift grating, with pitch $P_{1D-Nomura}$, 2nd diffraction orders are generated, so that the scanner-constraint leads to the condition (for monopole illumination with for simplicity a zero width $\sigma$ assumed):

$$p_{1D-Nomura} \leq \frac{2\lambda_{LA}}{NA_{LA}} = 286 \text{ nm.}$$

From the two constraints above, the admissible range of pitches for the 1-D PSG becomes very narrow (scaled here relative to the lithographic apparatus' edge $\lambda_{LA}/NA_{LA}$):

$$0.50 \leq \frac{\lambda_{LA}}{NA_{LA}} \frac{1}{p_{1D-Nomura}} = 0.54.$$

Thus using the Nomura 1D phase-shift grating, together with DBO, it is only possible to sample the wave-aberration function in a small fraction of the lithographic apparatus' exit pupil. The allowed area in the lithographic apparatus' exit pupil is shown as annulus 1808 in FIG. 18.

Before describing such embodiments in more detail, however, it is instructive to present an example environment in which embodiments of the present invention may be implemented.

FIG. 1 schematically depicts a lithographic apparatus. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
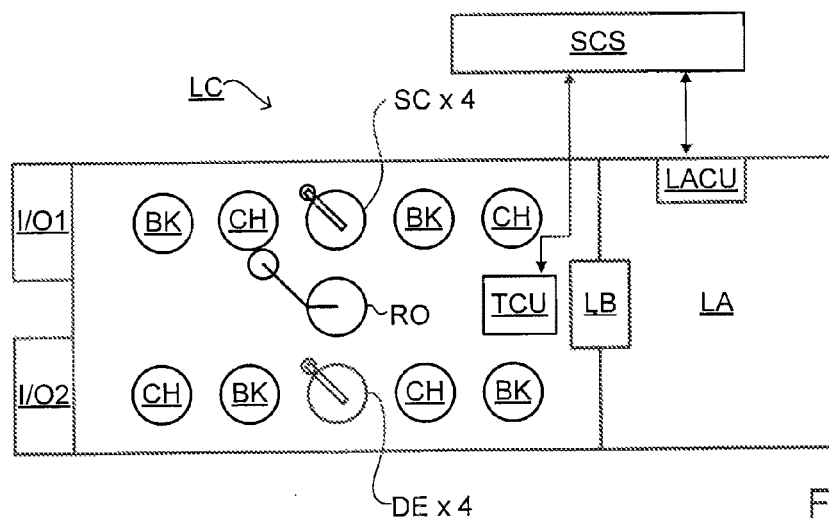
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
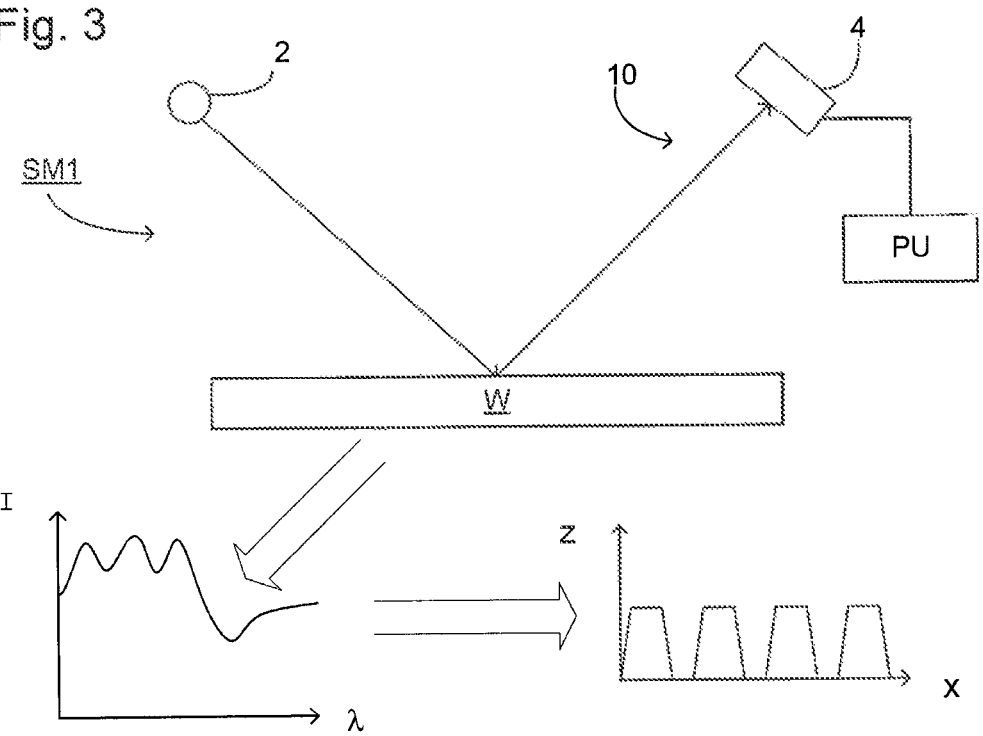
FIG. 3 depicts a first scatterometer.

FIG. 3 depicts a scatterometer which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
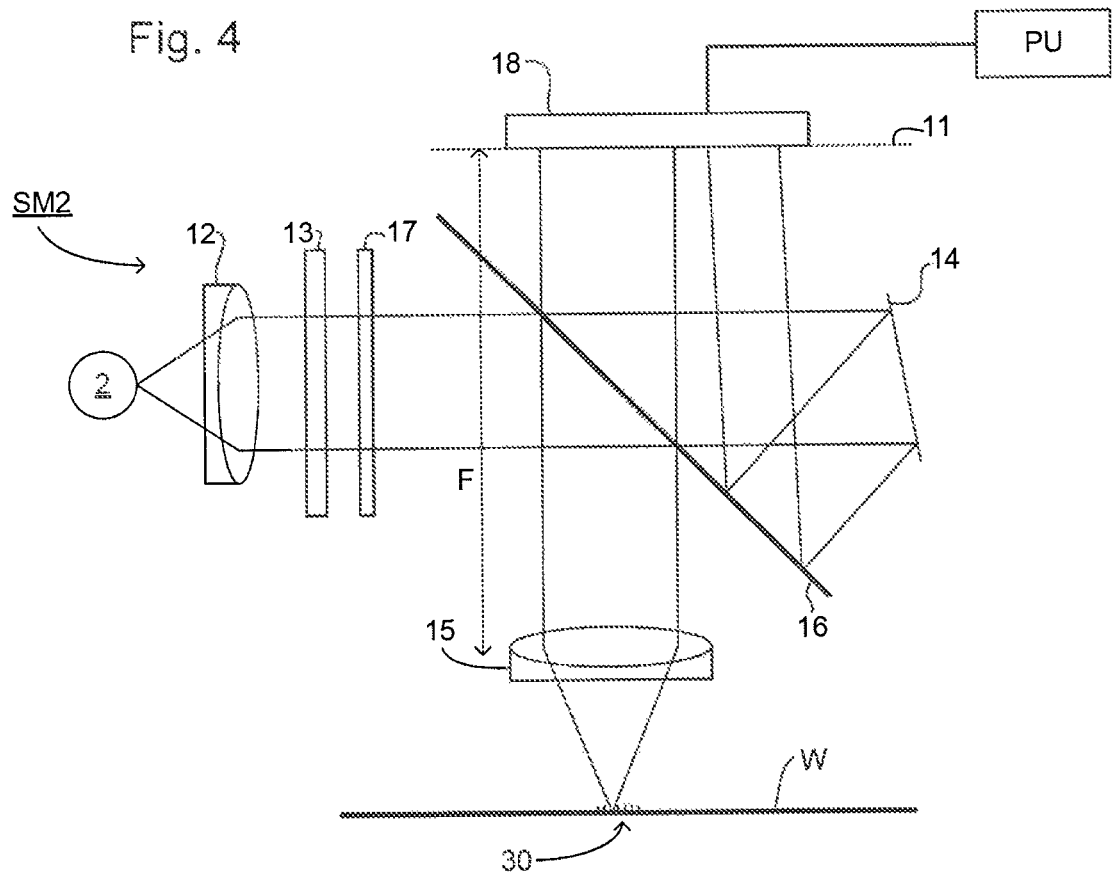
FIG. 4 depicts a second scatterometer.

Another scatterometer that may be used with the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating.

Figure 7:
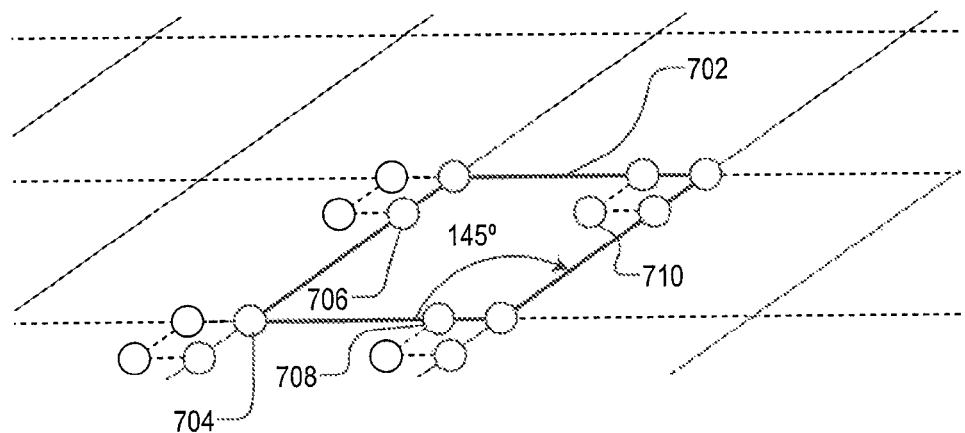
FIG. 7 illustrates a unit cell of the 2-D PSG at reticle level in accordance with an embodiment of the present invention.

An embodiment of the present invention uses two-dimensional phase-shift gratings (2-D PSGs). A unit-cell of the 2-D PSG at reticle level in accordance with an embodiment of the present invention is shown in FIG. 7. The unit cell 702 is oblique, with lattice vectors of equal length (a=280 nm at wafer level) that make an angle of 145°, and contains 4 square or cylindrical objects 704, 706, 708, 710 at respective positions (0,0), (0,3/4), (3/4,0) and (3/4,3/4) with respective transmissions given by i, 1, 1, –i (or 1, –i, i, 1). Outside of the square or cylindrical objects, the mask has no transmission.

Figure 10:
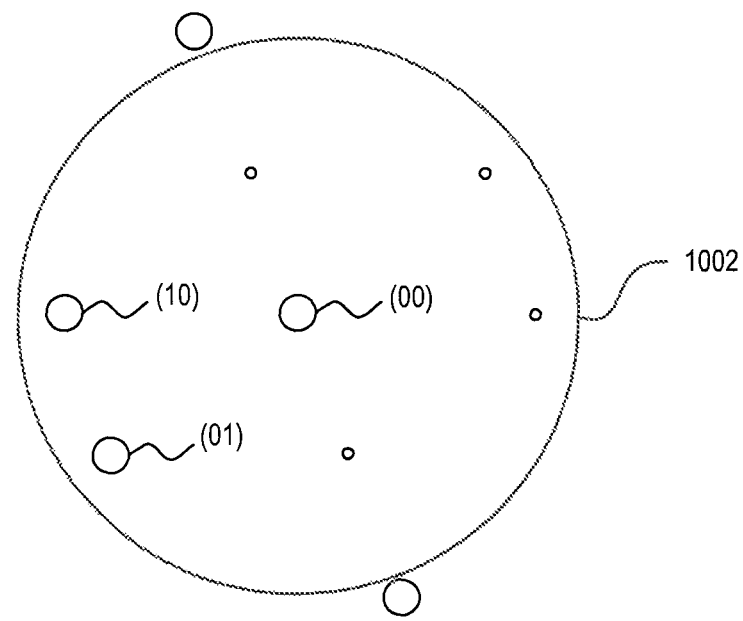
FIG. 10 illustrates a stretched diffraction pattern arising from the 2-D PSG of FIG. 9a in accordance with an embodiment of the present invention.

FIG. 9a illustrates a unit cell 902 on the reticle and FIG. 9b shows the corresponding diffraction pattern. FIG. 10 illustrates a stretched diffraction pattern arising from a compressed version of the 2-D PSG. With reference to FIG. 10, interference between the diffracted orders 10 and 01 (that are close to the edge of the exit pupil 1002) leads to a fringe pattern in the aerial/resist image which corresponds to the spatial frequencies 1102 and 1104 (with indices ($1\underline{1}$) and ($\underline{1}1$)) in the spectrum of the image shown in FIG. 11. The lateral shift of this fringe pattern is given by the phase difference of the interfering beams, that is, the difference in the values of the wave-aberration function (expanded in Zernikes) for the two orders $\chi_{10}$-$\chi_{01}$, denoted as 10 and 01 in FIG. 10. This shift can be obtained via an overlay measurement with the 2-D PSG patterning the top grating and an etched 1D-periodic line/space grating corresponding to the (11) spatial frequency as the bottom grating. A multitude of 2-D PSG gratings at different orientations at mask-level can be used so that the wave-aberration function is sampled at different azimuths in the lithographic apparatus' exit pupil. Furthermore, the position of the monopole in the lithographic apparatus' entrance pupil can be changed, for example using a programmable array of thousands of individually adjustable micromirrors, (reprogrammed after exposure of each die on the wafer), leading to extra diversity in the aberration measurement. Moreover, the lattice vector lengths and the angle between lattice vectors in the 2-D unit cell may be varied. In addition to the Zernike coefficients that are derived, it is also possible to determine the so-called true overlay vector (not related to aberrations, but related to a mechanical overlay) between the bottom grating and the top gratings. Note that overlay may be determined by applying two predetermined overlay biases +d and –d as denoted in FIG. 14, or by applying other overlay biases, for example –d, 0 and +d. This overlay vector is common to all targets that correspond with different orientations of the 2-D PSG overlay-stacks (for a fixed illumination setting).

Embodiments of the present invention are arrived at using the following approach: using a 2-D PSG; using an oblique unit cell; and making use of non-linear (or 2nd-order interference) imaging in the lithographic apparatus.

This approach is explained in more detail below.

1. From 1-D PSGs to 2-D PSGs

Figure 8A:
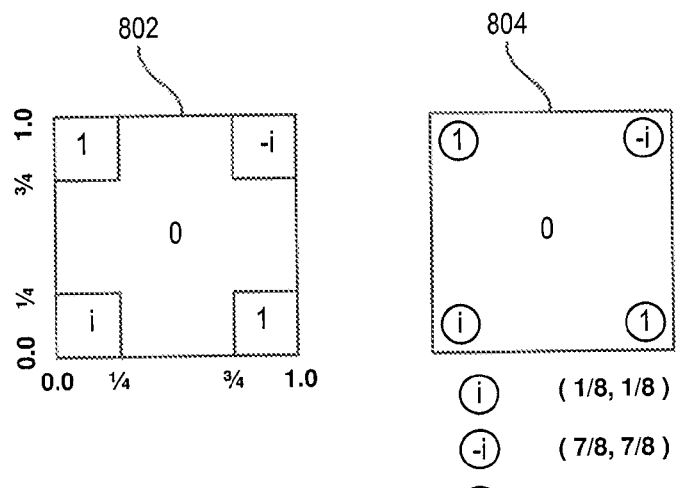
FIG. 8a illustrates square unit-cells of a 2-D PSG and FIG. 8b illustrates the resulting diffraction pattern of the reticle.

Square unit-cells 802 and 804 of 2-D PSGs are shown in FIG. 8a. In the left unit cell 802 there are square-shaped structures at each position. In the right-hand unit cell 804, there are contact-hole like structures at each position (1/8, 1/8), (7/8, 7/8), (7/8, 1/8) and (1/8, 7/8). The respective phase along the diagonal SW-NE are π/2 and π/2 (labeled with the reticle transmission i and –i respectively); the phases along the diagonal SE-NW are zero (labeled with the reticle transmission 1). In each unit cell 802 and 804, the central area outside of the square-like or circle-like features has zero transmission.

Figure 8B:
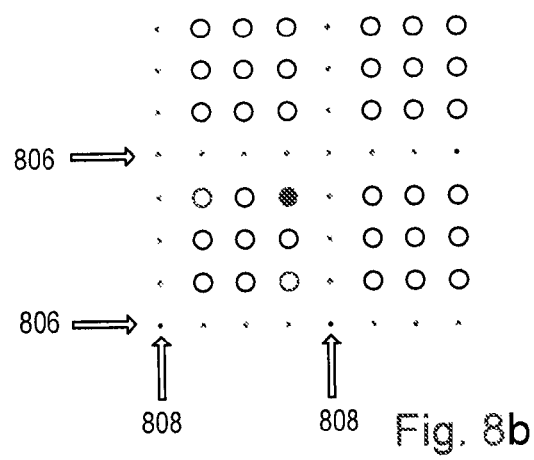

The diffraction pattern of the reticle is schematically drawn in FIG. 8b. Every fourth row 806 and every fourth column 808 of diffraction orders is "forbidden" for this 2-D PSG. Small dots represent forbidden diffraction orders (with zero intensity) and open circles represent allowed diffraction orders (with non-zero intensity). The black circle represents the monopole illumination zeroth order.

2. 2-D PSG with Oblique Unit-Cell

FIG. 9a illustrates a 2-D PSG with an oblique unit-cell and FIG. 9b illustrates the corresponding diffraction pattern. FIG. 10 illustrates a stretched diffraction pattern arising from the 2-D PSG. The wave-aberration function χ is sampled at the diffraction vectors (10) and (01).

An oblique unit-cell 902 for the 2-D PSG, is shown in FIG. 9a. The rows 904 and columns 906 of forbidden diffraction orders are now oriented relative to each other with an angle different from π/2. The zeroth order is at the center of the large circle in FIG. 9b. By choosing an appropriately small lattice constant a(=b), the stretched diffraction pattern of FIG. 10 can be realized. In that case, only the zeroth order (00) and the 1st orders of diffraction (10) and (01) are within the lithographic apparatus' exit pupil 1002. The orders that are forbidden because of the 2-D PSG are: ($\underline{10}$), ($\underline{01}$), ($\underline{11}$) and ($\underline{11}$) and are illustrated with small circles. The higher orders ($\underline{22}$) and ($\underline{22}$) are not forbidden, but are just outside of the scanner's NA (also taking into account the small size (σ) of the monopole in the entrance pupil).

3. Non-Linear Imaging Towards Resist-Image at Wafer-Level

Figure 11:
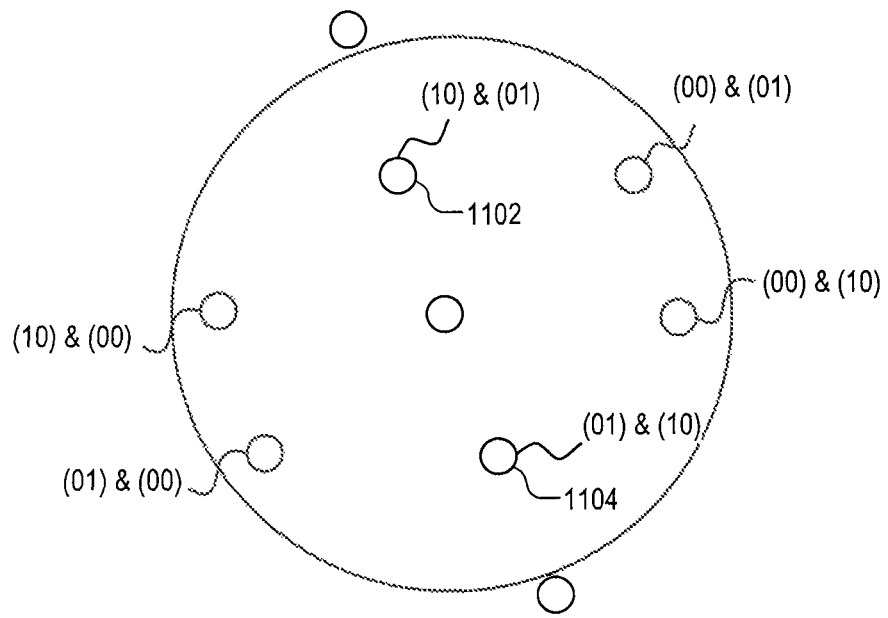
FIG. 11 illustrates a Fourier spectrum of the resist image/aerial image at wafer-level for a 2-D PSG, resulting from two-beam interferences of pairs of beams taken from the diffraction pattern of the mask in FIG. 10.

The three allowed orders (00), (10) and (01) lead to interferences giving rise to the resist image/aerial image at wafer-level, of which the (inversion-symmetric) Fourier spectrum is shown in FIG. 11.

The orders 1102 and 1104 in the spectrum of the image in FIG. 11 (with indices ($\underline{11}$) and ($\underline{11}$) respectively) can only result from non-linear or 2nd order interference between (10) and (01) orders, and vice versa, at reticle-level. The orders in FIG. 11 are labeled with reticle-level indices, for example (10) & (01), of the diffracted orders which interfere to produce the orders in the spectrum of the image. Starting from 9 o'clock, or W, and going clock-wise around the circle:

At the reticle level (10) & (00) leads to (10) in the image;
At the reticle level (10) & (01) leads to (1-1) in the image;
At the reticle level (00) & (01) leads to (0-1) in the image;
At the reticle level (00) & (10) leads to (-1 0) in the image;
At the reticle level (01) & (10) leads to (-1 1) in the image; and
At the reticle level (01) & (00) leads to (01) in the image.

The convention is that the resulting label is the difference of the reticle-level labels; first label-second label.

The fringe pattern in the resist image/aerial image has a pitch of 267 nm which is compatible with the angular scatterometer DBO metrology pitch requirement (with annular and quadrant illumination).

4. Target Rotation

Figure 12:
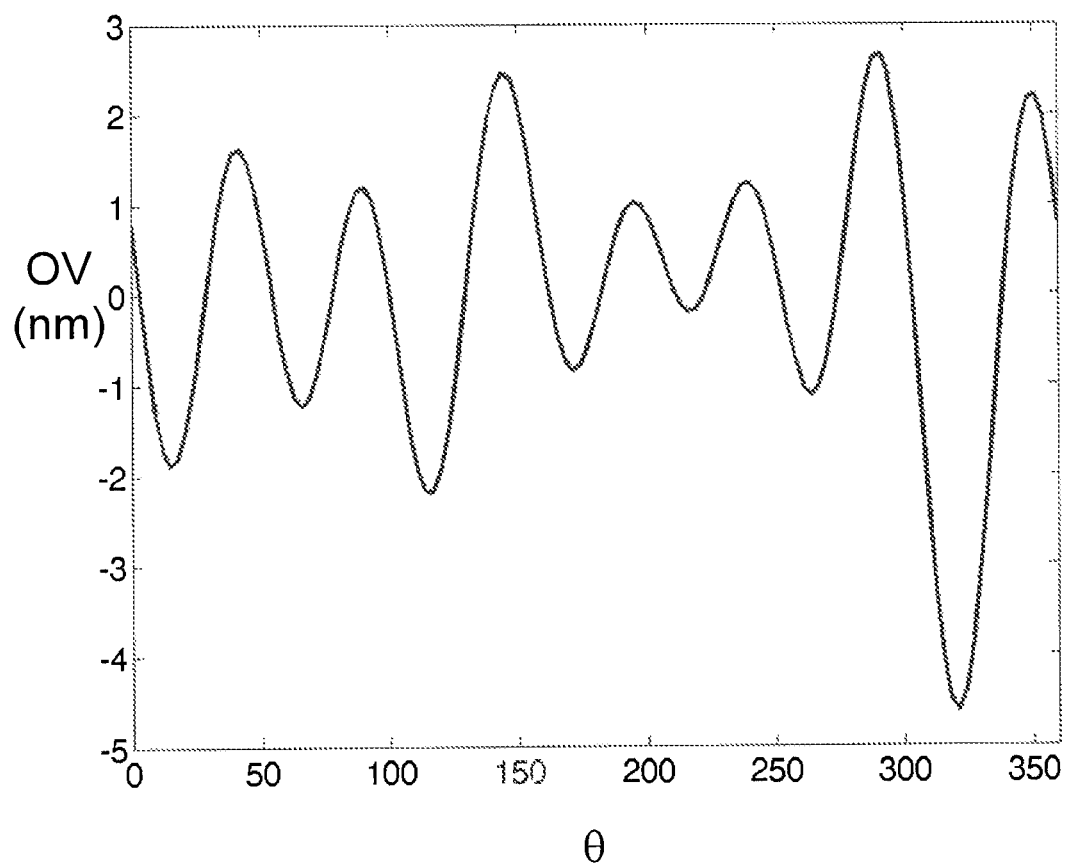
FIG. 12 is a graph of overlay as function of grating rotation for a given scanner aberration cocktail.

The target (PSG) orientation can be rotated so that the lithographic apparatus' wave aberration function is sampled at different azimuths (close to the edge of the exit pupil). For a typical aberration cocktail, FIG. 12 shows the measured overlay OV as a function of the rotation azimuth θ. Note that for a centered monopole, this procedure is not (very) sensitive to the spherical aberrations; this poor sensitivity arises from the fact that the lattice parameters of the 2D PSG unit-cell are still equal a=b, in combination with the finite size of the monopole (its σ-value). The center points of the monopole disks around the positions (10) and (01) feel the very same spherical aberrations in this case. The aberration cocktail is $Z2=3.2$ mλ, $Z12=9.5$ mλ, $Z16=6.4$ mλ, $Z26=3.2$ mλ and $Z51=-8.0$ mλ.

5. Programmable Mirror Array Monopole-Shifting

After a die exposure, the programmable mirror array setting can be altered so that the monopole is shifted in the lithographic apparatus' entrance pupil. In this way, it is also possible to measure the spherical aberrations. This is one example of repeating the overlay measurements for multiple illumination modes. As well as changing the position of the monopole, it is also possible to modify its size and shape.

6. 2-D PSG Unit-Cell with unequal Lattice Parameters

Another way to obtain sensitivity for the spherical aberrations is to use 2-D PSG gratings with (slightly) different lattice parameters a≠b, so that the (10) and (01) diffraction orders sample at different radii in the lithographic apparatus' exit pupil, thereby picking-up the spherical aberrations too.

7. Overlay-Stack Set-Up

Figure 13:
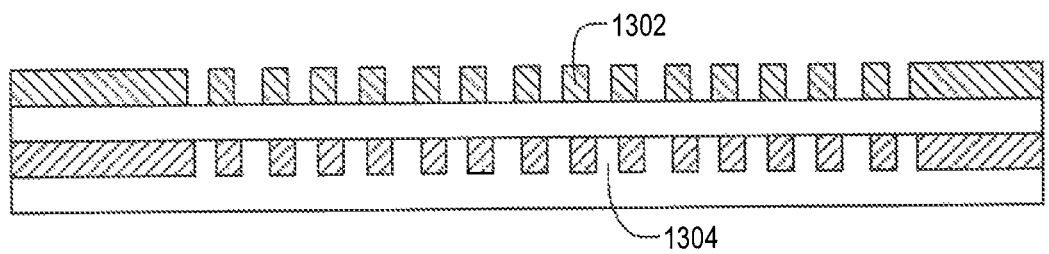
FIG. 13 illustrates an overlay stack for DBO measurement.

The overlay stack of gratings is illustrated schematically in FIG. 13, with the 2-D PSG grating 1302 on top of the reference structure 1304, which in this case is also a grating. The grating 1302 formed by the 2-D PSG will not look like the regular structure shown in FIG. 13 (in three dimensions it may mostly resemble a piece of swiss-cheese). However for the purpose of argument one can use FIG. 13 to explain the DBO principle because, due to the limited resolution of the scatterometer, it perceives the more complicated structure generated by the 2-D PSG as being a simple 1-D line/space grating. The offset of the two gratings 1302 and 1304 results from the sampled difference in the phase aberration function. The grating and structure may not necessarily be stacked on the substrate, and may not lie on top of each other. In this way, the methods described herein can also be used for box-in-box image-based overlay (IBO) overlay methods.

Although it is important to have a small monopole illumination mode to form the PSG grating, the first structure should not be formed with such a monopole. Instead it is preferable to use full incoherent illumination settings (monopole with large a) in order to minimize aberration effects on the reference structure.

Figure 14:
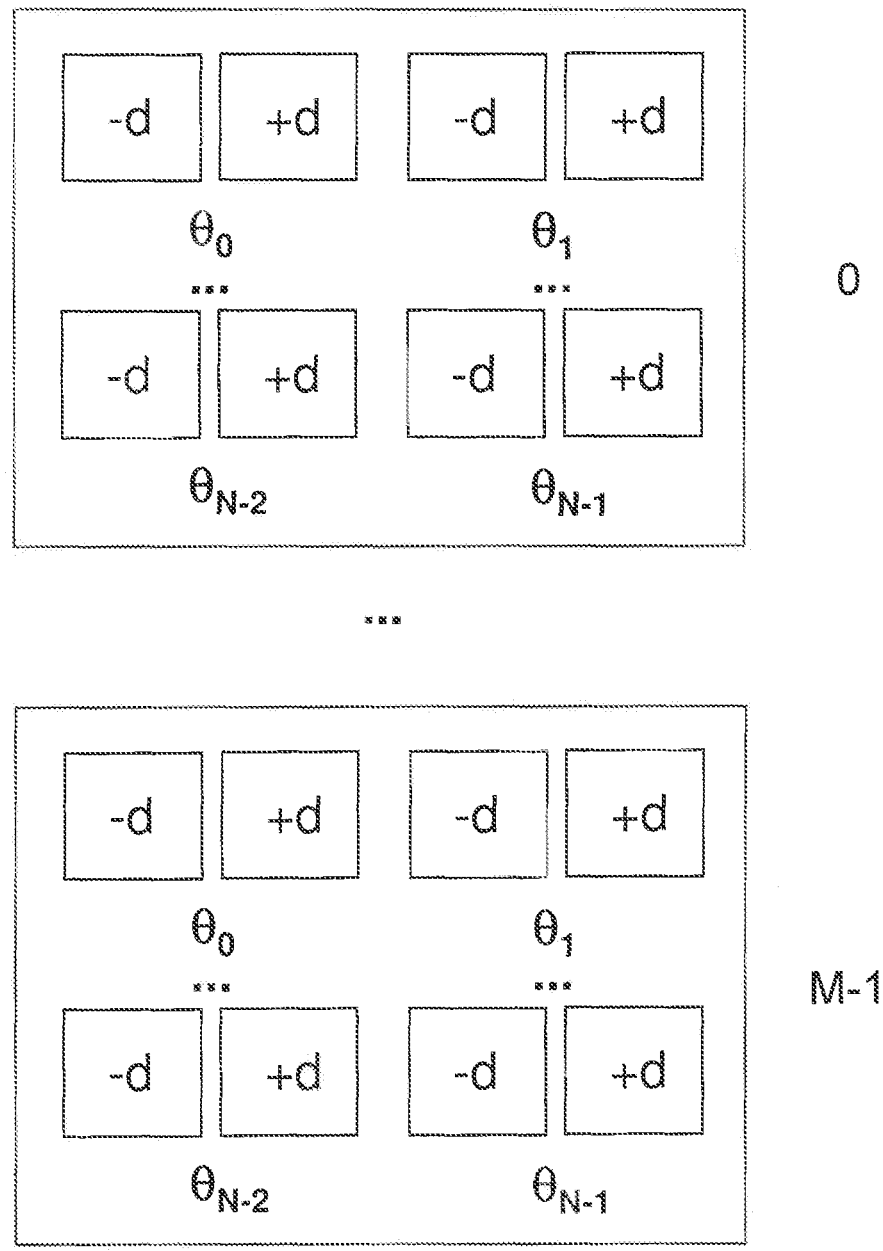
FIG. 14 illustrates measurement diversity possible with a single PSG for N rotations (θi) and M programmable mirror array monopole shiftings.

With reference to FIG. 14, a combination of target-rotations (N) and programmable mirror array monopole-shiftings (M) yields a set of overlay measurements of size N.M. The unknowns are, per programmable mirror array setting: the number P of Zernikes, and 2 "real" overlay values for x- and y-direction (reflecting the non-aberration overlay error between the two gratings in the aberration-free case). It is assumed that all rotated gratings are positioned close to each other so that they have a common non-aberration (or mechanical) overlay error. For the total number M of programmable mirror array settings, there is a total number of unknowns equal to P+2.M, which must be smaller than N.M. This is illustrated in FIG. 14. These unknown parameters can be fitted from a set of linear equations. While FIG. 14 shows a two-target configuration (with offsets −d and +d), it is also possible to use, for example, three targets per overlay measurement (for example with offsets −d, 0 and +d). Three targets may be used to take into account the non-linear response of the targets, due to their small pitch, to improve the overlay measurement.

Measurement diversity may be introduced by grating rotation and monopole-shift as mentioned above, which represents the additional diversity for a single PSG. Further diversity is possible by using different PSG's having different pitches (1D- and 2D-PSG's) and different angles and ratios between both unit vectors of the 2D-PSG's.

As well as image based overlay, both standard pupil-based DBO metrology and dark-field DBO metrology can be used to measure the overlay error in embodiments of the present invention.

The above description involves a circular monopole at the lithographic apparatus' entrance pupil, however with free-form programmable mirror array settings, the shape of the monopole can be altered. This can be done to intentionally increase sensitivity for particular aberrations. For instance, if the monopole would be a rectangular shape with its long axis orthogonal to the (11) direction in Fourier space, then (for the case a=b), the sensitivity to spherical aberrations would be minimal; on the other hand, if the monopole would be a rectangular shape with its long axis parallel to the (11) direction in Fourier space, then (for the case a=b), the sensitivity to spherical aberrations would be maximal.

The aberration measurement can be combined with measurements from the lithography apparatus internal metrology aberration sensors.

It can be beneficial to apply, with for instance a programmable mirror array aberration actuator, a predetermined controlled aberration offset based on the aberration function determined in accordance with embodiments of the present invention.

Figure 15A:
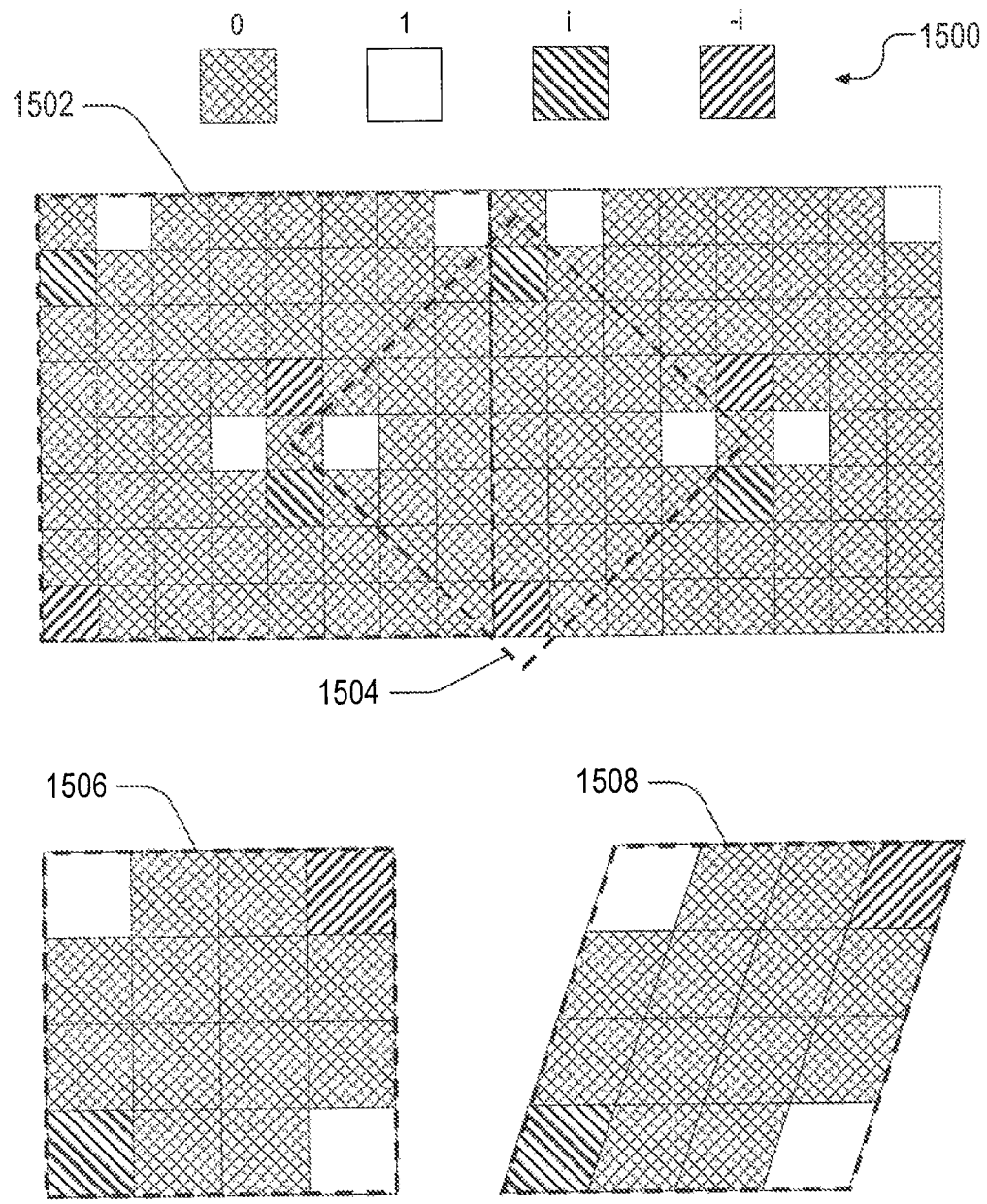
FIGS. 15a to 15c illustrate several different PSG Manhattan super cells used for computation each with respective example regular and oblique reticle unit cell designs.
Figure 15B:
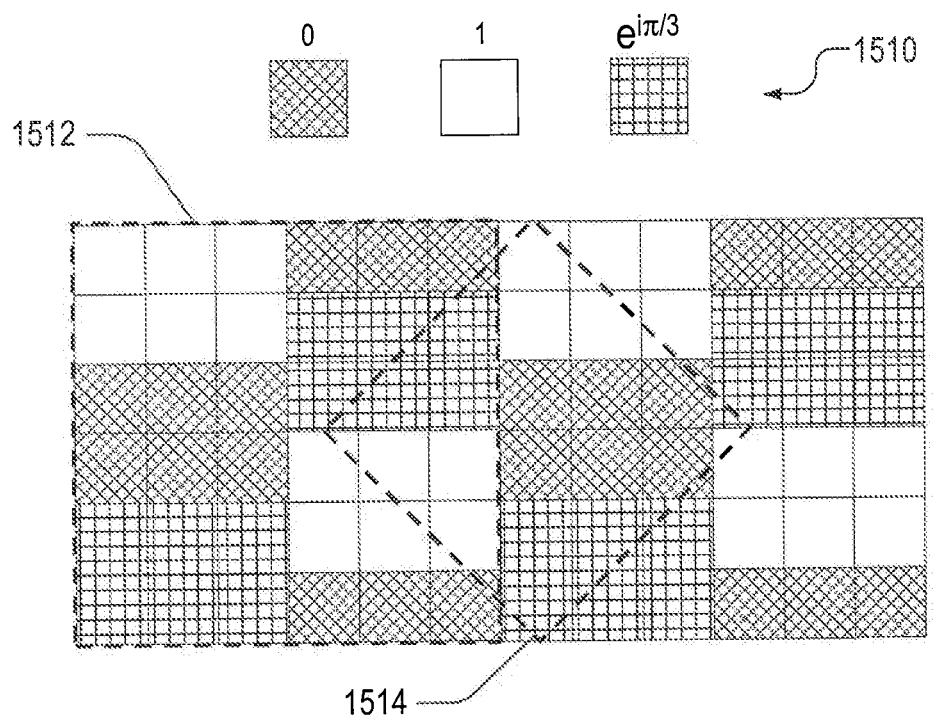
Figure 15B:
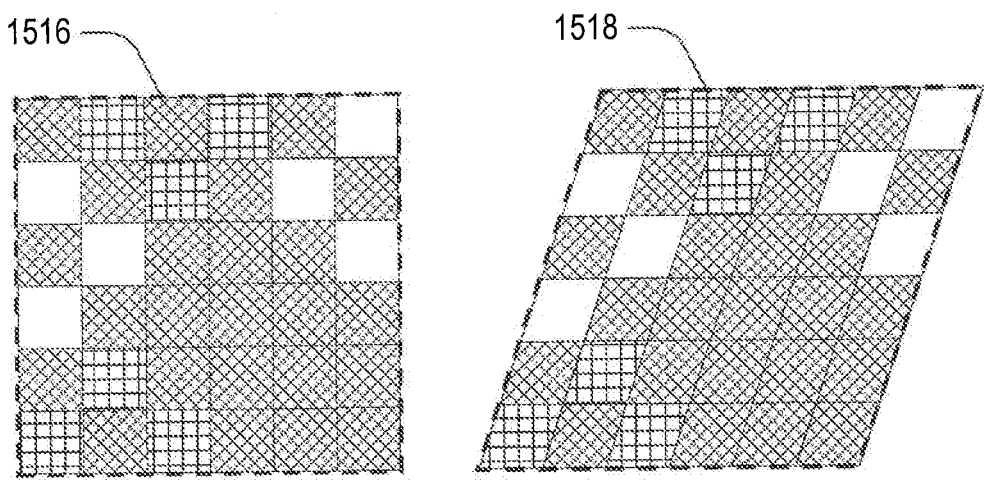
Figure 15C:
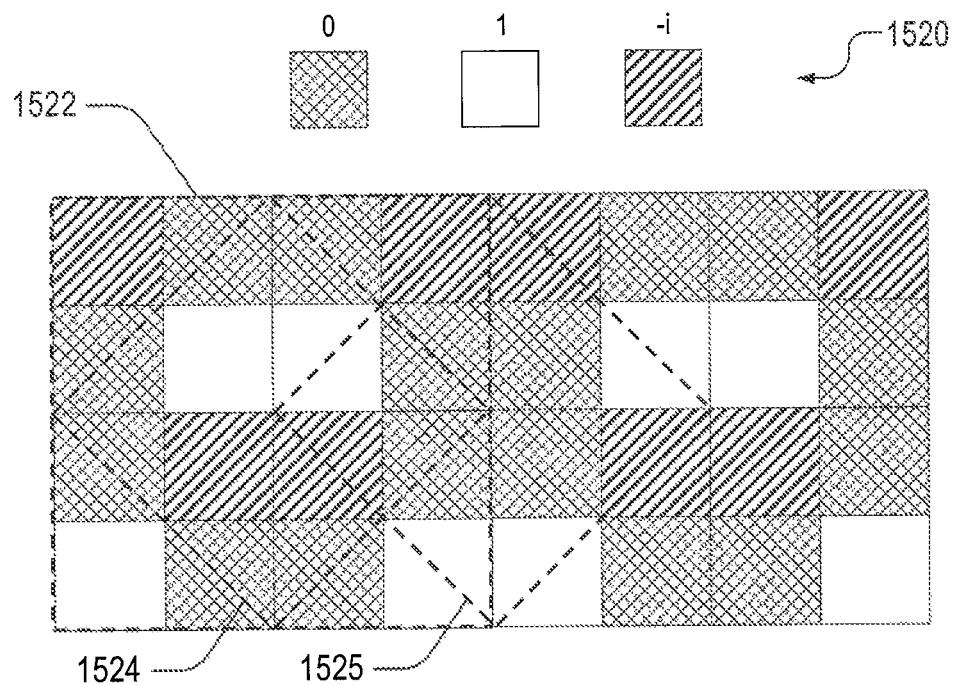
Figure 15C:
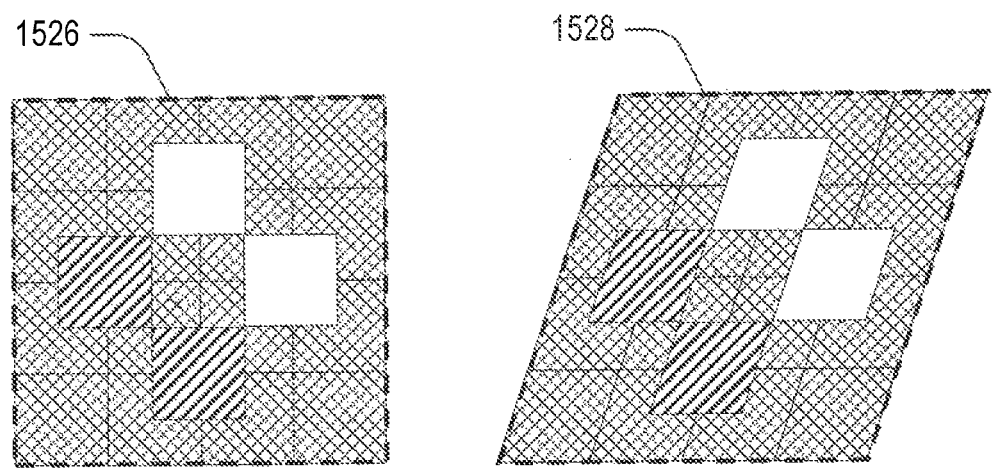

FIGS. 15a to 15c illustrate several different PSG Manhattan supercells used for computation each with respective example regular and oblique unit cell reticle designs. A "super" unit cell is used in computations to represent the actual minimum 2D-PSG unit cell on a Manhattan grid. A supercell is used for computations because the supercells remain rectangular when obliqueness is introduced.

FIG. 15a shows a supercell (dashed line 1502) repeated twice with the 2-D PSG unit cell (dashed line 1504) (one of many possibilities) also shown. The reticle transmission 0, 1, i, −i is illustrated by hatching in accordance with the key 1500. The 2-D PSG reticle unit cell 1506 corresponds to the 2-D PSG unit cell 1504 and also to the unit cell illustrated in FIG. 8a. An example oblique 2-D PSG reticle unit cell 1508 is also shown.

FIG. 15b shows a supercell (dashed line 1512) repeated twice with the 2-D PSG unit cell (dashed line 1514) (one of many possibilities) also shown. The reticle transmission 0, 1, $e^{i\pi/3}$ is illustrated by hatching in accordance with the key 1510. The 2-D PSG reticle unit cell 1516 corresponds to the 2-D PSG unit cell 1514. An example oblique 2-D PSG reticle unit cell 1518 is also shown.

FIG. 15c shows a supercell (dashed line 1522) repeated twice with the 2-D PSG unit cell (dashed line 1524) (one of many possibilities) also shown. Another example 2-D PSG unit cell 1525 is also shown. The reticle transmission 0, 1, −i is illustrated by hatching in accordance with the key 1520. The 2-D PSG reticle unit cell 1526 corresponds to the 2-D PSG unit cell 1524. An example oblique 2-D PSG reticle unit cell 1528 is also shown.

Figure 16:
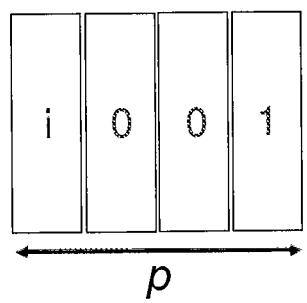
FIG. 16 illustrates Nomura's 1-D PSG unit cell and diffraction pattern.
Figure 16:
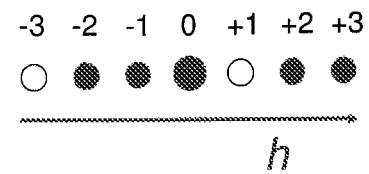

FIG. 16 illustrates Nomura's 1-D PSG unit cell and diffraction pattern. With reference to FIG. 16, Nomura's 1-D PSG has a 1D unit-cell of pitch p with consecutive quarters filled with i,0,0,1. Although the quarters are shown as rectangles, they are not to scale as the vertical extent of the grating is much greater on the reticle. The corresponding diffraction pattern is shown at the right-hand side of FIG. 16, where the diffraction order is denoted by h. The so-called forbidden diffraction orders (which have zero intensity) are denoted by open circles. They can be understood from the formula for the diffraction amplitudes F(h):

$$F(h) = i + \exp\left(2\pi i \frac{3h}{4}\right).$$

In order to have an overlay signal that can be directly interpreted in terms of the Zernikes of the lithography apparatus, the interferences between the mask diffraction orders that give rise to the aerial image at the wafer (or resist image) are limited to those between the zeroth order and the one allowed 1st order (in this example the −1st order). In such case, the aerial image can be described by a single cosine-fringe, with the phase being equal to the difference of the lithography apparatus' wave-aberration function sampled at the two diffraction orders that are interfering. If this condition would not be satisfied, then multiple cosine-fringes would be present in the aerial image, each with its own amplitude and its own phase. In such case, aberration retrieval would only be possible after a reconstruction step, in which the respective amplitudes are retrieved as a necessary intermediate step. Such a condition is already satisfied by the Nomura 1-D PSG on condition that the 2nd orders ±2 are completely outside of the lithography apparatus' exit pupil, so that, given a monopole illumination in the lithography apparatus' entrance pupil with a radius given by σ (relative to the edge of the lithography apparatus' pupil, $NA_{LA}/\lambda_{LA}$), the following condition holds for the pitch p of the grating:

$$p_{1D-Nomura} \leq \frac{2\lambda_{LA}}{NA_{LA}(1+\sigma)}$$

For a fully coherent illumination (σ=0), the maximum pitch is given by 2λLA/NA LA=286 nm.

Figure 17A:
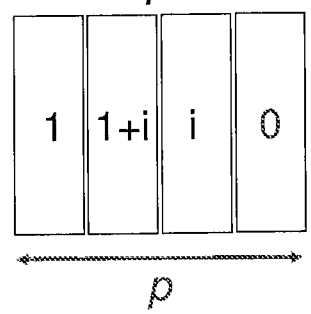
FIG. 17a illustrates a 1-D PSG unit cell and diffraction pattern in accordance with an embodiment of the present invention.
Figure 17A:
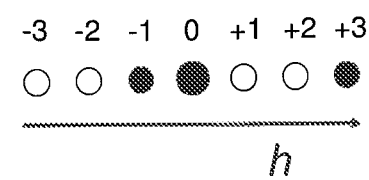

FIG. 17a illustrates a 1-D PSG unit cell and diffraction pattern in accordance with an embodiment of the present invention. With reference to FIG. 17a, a 1-D PSG has a 1D unit-cell with consecutive quarters filled with 1, 1+i, i, 0. The corresponding diffraction pattern is shown at the right-hand side of FIG. 17a, where the diffraction order is denoted by h. The so-called forbidden diffraction orders (which have zero intensity) are denoted by open circles. They can be understood from the formula for the diffraction amplitudes F(h):

$$F(h) = 1 + (1+i)\exp\left(2\pi i \frac{h}{4}\right) + i\exp\left(2\pi i \frac{h}{2}\right).$$

For this 1-D PSG, the 2nd order reflections are also forbidden. In order to meet the requirement of a single cosine-fringe in the aerial image, it is now sufficient to have the 3rd orders completely outside of the lithographic apparatus' exit pupil, so that, given a monopole illumination in the lithographic apparatus' entrance pupil with a radius given by σ (relative to the edge of the lithographic apparatus' pupil, $NA_{LA}/\lambda_{LA}$), the following condition holds for the pitch p of the grating:

$$p_{1D-new} \leq \frac{3\lambda_{LA}}{NA_{LA}(1+\sigma)}$$

For a fully coherent illumination (σ=0), the maximum pitch is given by 3λLA/NA LA=429 nm.

Figure 17B:
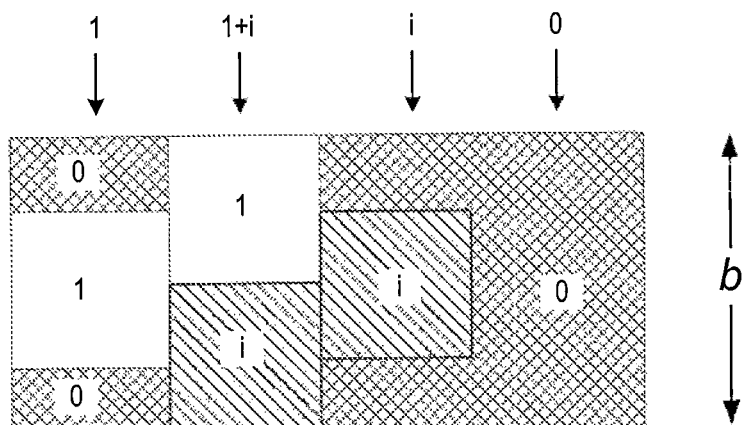
FIG. 17b illustrates a "chopped" 1-D PSG and FIG. 17c illustrates an alternative "chopped" 1-D PSG in accordance with embodiments of the present invention.
Figure 17C:
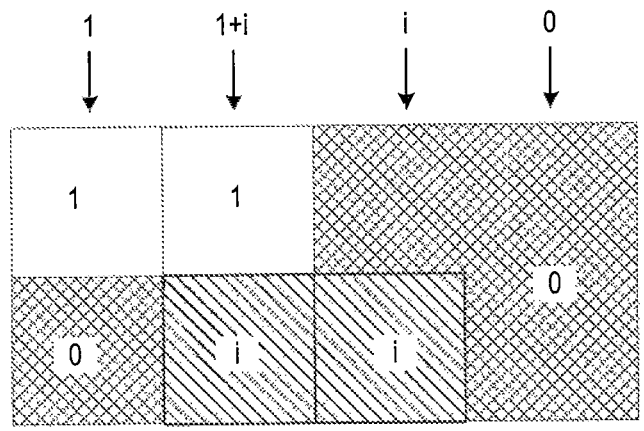

The 1-D PSG grating of FIG. 17a has three different phases and two different amplitudes, which makes the reticle difficult to manufacture. A solution that enables cheaper reticle manufacturing is the "chopped" version of this 1-D PSG, with two alternative "choppings" shown in FIGS. 17b and 17c. FIG. 17b illustrates a "chopped" 1-D PSG unit cell and FIG. 17c illustrates an alternative "chopped" 1-D PSG unit cell. Each unit cell is repeated vertically with a periodicity b which is small enough so that no "vertical" diffraction orders within the lithography apparatus' exit pupil are generated. Note that the x- and y-axes are not drawn to scale, so that the square-like features can equally well be rectangular in shape.

For this 1-D PSG, compared to Nomura's 1-D PSG, no 2nd diffraction orders are generated. However, a 3rd diffraction order is generated, so that the scanner-constraint leads to the condition (for monopole illumination with for simplicity a zero width σ assumed):

$$p_{1D-new} \leq \frac{3\lambda_{LA}}{NA_{LA}} = 429 \text{ nm.}$$

From the two constraints, the admissible range of pitches for the new 1-D PSG becomes significantly enlarged when compared to Nomura's 1-D PSG (scaled here relative to the lithographic apparatus' edge $\lambda_{LA}/NA_{LA}$):

$$0.33 \leq \frac{\lambda_{LA}}{NA_{LA}} \frac{1}{p_{1D-new}} = 0.54.$$

FIG. 18 illustrates the allowed area for aberration sampling in the lithographic apparatus' exit pupil using embodiments of the present invention. The allowed area 1802 that can be assessed with the 1-D PSGs according to an embodiment of the present invention is shown in the lithographic apparatus' exit pupil 1804. The outer area 1806 of the lithographic apparatus' exit pupil 1804 can be assessed with the 2-D PSGs according to an embodiment of the present invention.

The (limited) reduction of the numerical aperture of the scanner (below 1.35) can further enlarge the area in the scanner's exit-pupil that can be sampled with the improved 1-D PSG (the value of the lower-limit of 0.33 in the above formula can hereby be extended).

It can be seen that to successfully reconstruct the aberration function there is a way to probe a far larger fraction of the phase function in the pupil via overlay measurements.

This is achieved by using two types of PSGs: 1D-chopped PSGs and 2D-PSG's that are allowed to have an oblique unit cell with not necessarily equal lattice vectors (a≠b). The two types of PSG may be included in the same reticle to combine the respective measurement methods to cover most of the area of the lithographic apparatus' exit pupil.

These PSGs allow the sampling of different regions of the exit pupil as follows: for the 1-D-chopped PSG the −2nd, −1st and +2nd orders are zero, thus allowing sampling of the phase closer to the center of the exit pupil; the 2-D PSGs generate three contributing orders with the pair of diffracted orders in the area closer to the edge of the lithography apparatus' exit pupil (the resist image being formed by superposition of three fringe patterns). The fringe pattern generated by interference between $\chi_{01}$ and $\chi_{10}$ has a pitch suitable for DBO with an angular resolved scatterometer. Interference with $\chi_{00}$ generates high frequency fringes that are not resolved by the angular resolved scatterometer.

Figure 19:
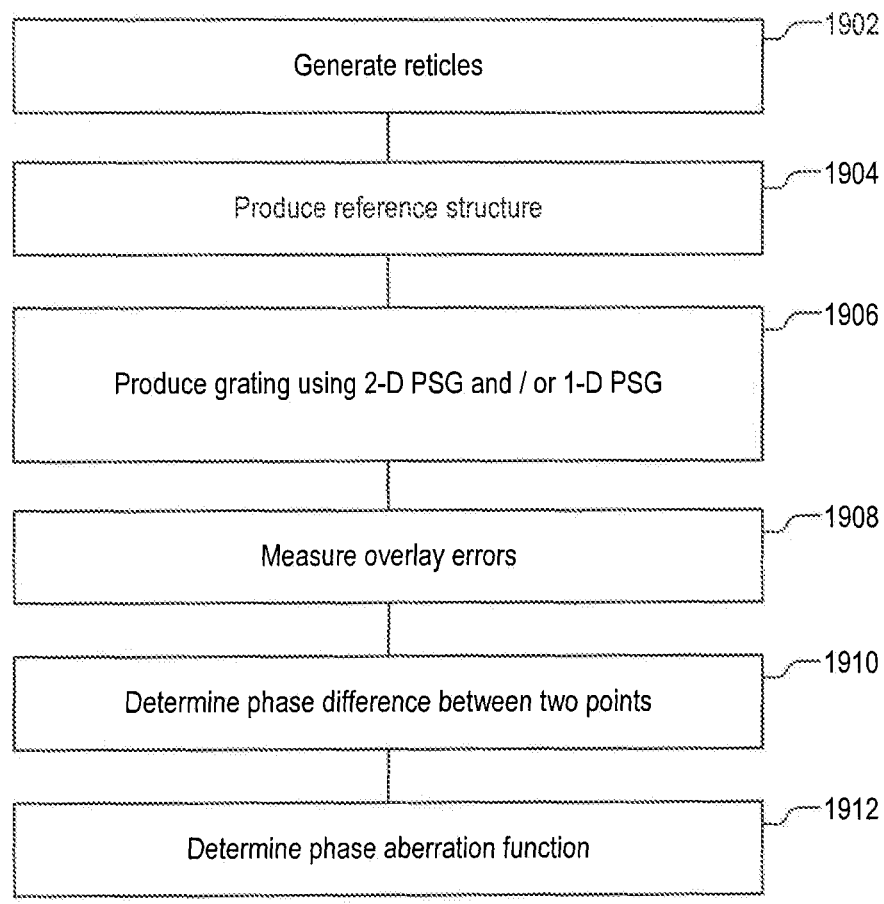
FIG. 19 is a flowchart of the steps according to embodiments of the present invention.

With reference to FIG. 19, a first method is illustrated of measuring phase differences between pairs of points in the aberration function of a lithographic apparatus and the subsequent determination of the aberration function, corresponding to the description of FIGS. 7 to 15. After the reticles are generated 1902, The method has the steps:

a) Using the lithographic apparatus to produce 1904 a first reference structure on a substrate. The first reference structure is produced using an illumination mode of the lithographic apparatus configured to minimize effects of phase aberration of the lithographic apparatus.

b) Using the lithographic apparatus to produce 1906 a first grating on the substrate by illuminating the reticle with radiation. The reticle comprises an area with a phase-shift grating periodic in first and second directions, which may be at an oblique angle to each other. The reticle is configured to produce in the exit pupil of the lithographic apparatus a pair of diffracted orders of the radiation other than the zeroth order while forbidding any other diffracted orders of the radiation in the exit pupil and to produce interference fringes formed by interference between the pair of diffracted orders of the radiation. The interference fringes contribute to the definition of the first grating on the substrate. The interference fringes together with the interferences between the zeroth order and each of the pair of diffracted orders may define the first grating on the substrate.

c) Measuring 1908 the overlay error between the first grating and the first reference structure.

d) Determining 1910, from the measured overlay error, a phase difference between regions in the exit pupil of the lithographic apparatus sampled by the respective interfering orders. This step may be omitted, so that the measurement of the phase aberration is done simply by measuring the overlay error, which may then be monitored and/or used to adjust the lithographic apparatus to control the aberrations. A single overlay value can not give conclusive information on the phase aberration function. The best that can be obtained from a single overlay value, while assuming mechanical overlay error to be zero, is a value for the phase difference between two regions of the aberration function. One can choose to use this as an indicator for the presence of aberrations, but it does not allow one to discriminate between different aberrations and does not even guarantee that one will measure anything if aberrations are present. (e.g. it is possible to measure zero overlay for a target while there are aberrations present). It is a set of different overlay targets that enable systematic aberration sensitivity and reconstruction functionality.

The order of the two a) and b) exposures may be reversed.

Step c) may be performed using an angular resolved scatterometer and a diffraction based overlay (DBO) measurement, using a combination of measurement wavelength and numerical aperture at which interference fringes formed by interference between any of the pair of diffracted orders of the radiation and zeroth order non-diffracted radiation are not resolved within the numerical aperture that is used. Steps a) and b) are typically performed as separate exposure steps of different respective resist layers.

Alternatively, the step of measuring the overlay error may be performed using an image-based overlay (IBO) measurement. In this case, the steps a) and b) may be performed as separate exposure steps of different respective resist layers or as a double exposure of the same resist layer. When both steps a) and b) are performed on a single resist layer (so no first grating/structure is produced) then the double-exposed resist is developed. In such a double-exposure mode, the patterns may be imaged on two neighboring areas, the relative shift of which can then be measured by an in-plane image-based overlay method.

Steps a) to c) may be repeated for multiple pitches of the first grating in one or more of the first and second directions and/or multiple angles between the first and second directions and/or with multiple orientations, with correspondingly adapted multiple first reference structures. A phase aberration function for the exit pupil of the lithographic apparatus can then be determined 1912 using the measured overlay errors.

Steps a) to c) may be repeated for multiple illumination modes of the lithographic apparatus with correspondingly adapted multiple first reference structures.

The phase aberration function may be determined 1912 using a Zernike polynomial expansion to estimate the phase aberration function.

Again with reference to FIG. 19, a second method is illustrated of measuring phase differences between pairs of points in the aberration function of a lithographic apparatus and the subsequent determination of the aberration function, corresponding to the description of FIGS. 16 to 17. After the reticles are generated 1902, The method has the steps:

a) using the lithographic apparatus to produce 1904 a second reference structure on a substrate. The second reference structure is produced using an illumination mode of the lithographic apparatus configured to minimize effects of phase aberration of the lithographic apparatus.

b) using the lithographic apparatus to produce 1906 a second grating on the substrate by illuminating a reticle with radiation. The reticle comprises an area with a phase-shift grating configured to produce in the exit pupil of the lithographic apparatus an allowed diffracted first order of the radiation while forbidding diffraction of another first order and both second orders of the radiation in the exit pupil and to produce interference fringes formed by interference between a zeroth order of the radiation and the allowed diffracted first order of the radiation. The interference fringes define the second grating on the substrate. The phase-shift grating may comprise regions of subsegmentation with different phase shift interleaved with a spacing small enough so that in use any non-zero diffracted orders arising from the interleaving fall outside the exit pupil of the lithographic apparatus. The regions of different phase shift may combine to produce an average transmission of 1+i. The phase-shift grating typically comprises a periodic transmission comprising the transmissions 1, 1+i, i, 0 or their inversion. Cyclic permutation of transmissions 1, 1+i, i, 0 or their inversion are also suitable. Other suitable configurations are possible, with different subdivisions of the unit-cell, rather than the four subdivisions illustrated in FIG. 17a.

c) Measuring 1908 the overlay error between the second grating and the second reference structures.

There is an alternative way to achieve 1+i rather than chopping along the lines, perpendicular to the direction of periodicity of the PSG, as illustrated in FIGS. 17b and 17c. The 1, 1+i, 1, 0 unit cell be achieved by chopping in the same direction of periodicity of the PSG, for example 10101010 1i1i1i1i 10101010 00000000. In this approach, there are some small phase subtleties that are less favorable than chopping perpendicular to the direction of periodicity.

d) Determining 1910, from the measured overlay error, a phase difference between regions in the exit pupil of the lithographic apparatus sampled by the respective interfering orders of the second grating. This step may be omitted, so that the measurement of the phase aberration is done simply by measuring the overlay error, which may then be monitored and/or used to adjust the lithographic apparatus to control the aberrations.

The order of the two a) and b) exposures may be reversed.

Step c) may be performed using an angular resolved scatterometer and a diffraction based overlay (DBO) measurement, using a combination of measurement wavelength and numerical aperture at which interference fringes formed by interference between any of the pair of diffracted orders of the radiation and zeroth order non-diffracted radiation are not resolved within the numerical aperture that is used. Steps a) and b) are typically performed as separate exposure steps of different respective resist layers.

Alternatively, the step of measuring the overlay error may be performed using an image-based overlay (IBO) measurement. In this case, the steps a) and b) may be performed as separate exposure steps of different respective resist layers or as a double exposure of the same resist layer. When both steps a) and b) are performed on a single resist layer (so no first grating/structure is produced) then the double-exposed resist is developed. In such a double-exposure mode, the patterns may be imaged on two neighboring areas, the relative shift of which can then be measured by an in-plane image-based overlay method.

Steps a) to c) may be repeated for multiple pitches of the second grating and/or with multiple orientations, with correspondingly adapted multiple second reference structures. A phase aberration function for the exit pupil of the lithographic apparatus can then be determined 1912 using the measured overlay errors.

Steps a) to c) may be repeated for multiple illumination modes of the lithographic apparatus with correspondingly adapted multiple second reference structures.

The phase aberration function may be determined 1912 using a Zernike polynomial expansion to estimate the phase aberration function.

The first and second methods described above with reference to FIG. 19 may be combined so that one reticle patterns both the first and second reference structures and another reticle has both the 2-D PSG described with reference to FIGS. 7 to 15 and the 1-D PSG described with reference to FIGS. 16 to 17.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein. The computer program may be executed on a processor, such as processing unit PU in the scatterometer.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
   producing, using a lithographic apparatus, a first reference structure on a substrate;
   producing, using the lithographic apparatus, a first grating on the substrate by illuminating a reticle with radiation, the reticle comprising an area with a phase-shift grating periodic in first and second directions and configured to produce:
   in an exit pupil of the lithographic apparatus, a pair of diffracted orders of the radiation other than the zeroth order, while forbidding other diffracted orders of the radiation in the exit pupil; and
   interference fringes formed by interference between the pair of diffracted orders of the radiation, the interference fringes contributing to the definition of the first grating on the substrate; and
   measuring overlay error between the first grating and the first reference structure.

2. The method of claim 1, wherein the interference fringes together with the interferences between the zeroth order and each of the pair of diffracted orders define the first grating on the substrate.

3. The method of claim 1, wherein the first and second directions are at an oblique angle to each other.

4. The method of claim 1, wherein the measuring the overlay error is performed by an angular resolved scatterometer making a diffraction based overlay (DBO) measurement.

5. The method of claim 4, wherein the measuring the overlay error by the angular resolved scatterometer is performed using a combination of measurement wavelength and numerical aperture at which interference fringes formed by interference between any of the pair of diffracted orders of the radiation and zeroth order non-diffracted radiation are not resolved within the numerical aperture.

6. The method of claim 1, wherein the measuring the overlay error is produces an image-based overlay (IBO) measurement.

7. The method of claim 6, wherein the first reference structure and the first grating are produced by a double exposure of the same resist layer.

8. The method of claim 1, wherein the first reference structure and the first grating are produced by separate exposure steps of different respective resist layers.

9. The method of claim 1, further comprising determining, from the measured overlay error, a phase difference between regions in the exit pupil of the lithographic apparatus sampled by the respective interfering orders.

10. The method of claim 1, wherein the producing and measuring are repeated for multiple pitches of the first grating in either the first direction or the second direction with correspondingly adapted multiple first reference structures and further comprises determining, from the measured overlay errors, a phase aberration function for the exit pupil of the lithographic apparatus.

11. The method of claim 10, wherein the phase aberration function is determined using a Zernike polynomial expansion to estimate the phase aberration function.

12. The method of claim 1, wherein the producing and measuring are repeated for multiple orientations of the first grating with correspondingly adapted multiple first reference structures and further comprises the determining, from the measured overlay errors, a phase aberration function for the exit pupil of the lithographic apparatus.

13. The method of claim 1, wherein the producing and measuring are repeated for multiple illumination modes of the lithographic apparatus with correspondingly adapted multiple first reference structures and further comprises the determining, from the measured overlay errors, a phase aberration function for the exit pupil of the lithographic apparatus.

14. The method of claim 1, wherein the first reference structure is produced by an illumination mode of the lithographic apparatus configured to minimize effects of phase aberration of the lithographic apparatus.

15. A method comprising:
   producing, by a lithographic apparatus, a first reference structure on a substrate;

producing, by the lithographic apparatus, a first grating on the substrate by illuminating a reticle with radiation, the reticle comprising an area with a phase-shift grating configured to produce:
  in an exit pupil of the lithographic apparatus an allowed diffracted first order of the radiation while forbidding diffraction of another first order and both second orders of the radiation in the exit pupil; and
  interference fringes formed by interference between a zeroth order of the radiation and the allowed diffracted first order of the radiation, the interference fringes defining the second grating on the substrate; and
measuring an overlay error between the second grating and the second reference structure.

16. The method of claim 15, wherein the phase-shift grating comprises regions of subsegmentation with different phase shift interleaved with a spacing small enough so that any non-zero diffracted orders arising from the interleaving fall outside the exit pupil of the lithographic apparatus.

17. The method of claim 16, wherein the regions of different phase shift combine to produce an average transmission of 1+i.

18. The method of claim 15, wherein the phase-shift grating comprises a periodic transmission comprising the transmissions 1, 1+i, i, 0 or their inversion.

19. The method of claim 15, wherein the phase-shift grating comprises a periodic transmission comprising a cyclic permutation of transmissions 1, 1+i, i, 0 or their inversion.

20. The method of claim 15, wherein the measuring the overlay error is performed by an angular resolved scatterometer making a diffraction based overlay (DBO) measurement.

21. The method of claim 15, wherein the measuring the overlay error produces an image-based overlay (IBO) measurement.

22. The method of claim 21, wherein the first reference structure and the first grating are produced by a double exposure of the same resist layer.

23. The method of claim 15, wherein the first reference structure and the first grating are produced by separate exposure steps of different respective resist layers.

24. The method of claim 15, further comprising the determining, from the measured overlay error, a phase difference between regions in the exit pupil of the lithographic apparatus sampled by the respective interfering orders.

25. The method of claim 15, wherein the producing and measuring are repeated for multiple pitches of the first grating in either the first direction or the second direction with correspondingly adapted multiple first reference structures and further comprises determining, from the measured overlay errors, a phase aberration function for the exit pupil of the lithographic apparatus.

26. The method of claim 25, wherein the phase aberration function is determined using a Zernike polynomial expansion to estimate the phase aberration function.

27. The method of claim 15, wherein the producing and measuring are repeated for multiple orientations of the first grating with correspondingly adapted multiple first reference structures and further comprises the determining, from the measured overlay errors, a phase aberration function for the exit pupil of the lithographic apparatus.

28. The method of claim 15, wherein the producing and measuring are repeated for multiple illumination modes of the lithographic apparatus with correspondingly adapted multiple first reference structures and further comprises the determining, from the measured overlay errors, a phase aberration function for the exit pupil of the lithographic apparatus.

29. The method of claim 15, wherein the first reference structure is produced by an illumination mode of the lithographic apparatus configured to minimize effects of phase aberration of the lithographic apparatus.

30. A method comprising:
  producing by, a lithographic apparatus, a first reference structure on a substrate;
  producing by, the lithographic apparatus, a second reference structure on the substrate;
  producing by, the lithographic apparatus a first grating on the substrate by illuminating a reticle with radiation, the reticle comprising an first area with a first phase-shift grating periodic in first and second directions and configured to produce in an exit pupil of the lithographic apparatus:
    a pair of diffracted orders of the radiation other than the zeroth order, while forbidding other diffracted orders of the radiation in the exit pupil; and
    interference fringes formed by interference between the pair of diffracted orders of the radiation, the interference fringes contributing to the definition of the first grating on the substrate;
  producing by, the lithographic apparatus a second grating on the substrate by illuminating the reticle with radiation, the reticle comprising an second area with a second phase-shift grating configured to produce in the exit pupil of the lithographic apparatus:
    an allowed diffracted first order of the radiation, while forbidding diffraction of another first order and both second orders of the radiation in the exit pupil and
    interference fringes formed by interference between a zeroth order of the radiation and the allowed diffracted first order of the radiation, the interference fringes defining the second grating on the substrate;
  measuring the overlay error between the first grating and the first reference structure; and
  measuring the overlay error between the second grating and the second reference structure.

31. The method claim 30, wherein the producing and measuring are repeated for multiple pitches of the first grating in one or more of the first and second directions with correspondingly adapted multiple first reference structures and further comprising determining, from the measured overlay errors, a phase aberration function for the exit pupil of the lithographic apparatus.

32. The method claim 31, wherein the phase aberration function is determined using a Zernike polynomial expansion to estimate the phase aberration function.

33. The method claim 30, wherein the producing and measuring are repeated for multiple orientations of the first grating with correspondingly adapted multiple first reference structures and further comprising determining, from the measured overlay errors, a phase aberration function for the exit pupil of the lithographic apparatus.

34. The method claim 30, wherein the producing and measuring are repeated for multiple illumination modes of the lithographic apparatus with correspondingly adapted multiple first reference structures and further comprising determining, from the measured overlay errors, a phase aberration function for the exit pupil of the lithographic apparatus.

35. The method claim 30, wherein the producing and measuring are repeated for multiple pitches of the second grating with correspondingly adapted multiple second reference structures and wherein the method comprises the determining, from the measured overlay errors, a phase aberration function for the exit pupil of the lithographic apparatus.

36. The method claim 30, wherein the producing and measuring are repeated for multiple orientations of the second grating with correspondingly adapted multiple second reference structures and further comprising determining, from the measured overlay errors, a phase aberration function for the exit pupil of the lithographic apparatus.

37. The method claim 30, wherein steps of claim 30 are repeated for multiple illumination modes of the lithographic apparatus with correspondingly adapted multiple second reference structures and further comprising determining, from the measured overlay errors, a phase aberration function for the exit pupil of the lithographic apparatus.

38. The method claim 30, wherein the first and second reference structures are produced by an illumination mode of the lithographic apparatus configured to minimize effects of phase aberration of the lithographic apparatus.

39. A lithographic apparatus comprising:
   a patterning device configured to produce a first grating on a substrate by illuminating the patterning device with radiation, the patterning device comprising:
      an area with a phase-shift grating periodic in first and second directions and configured to produce in the exit pupil of the lithographic apparatus:
         a pair of diffracted orders of the radiation other than the zeroth order, while forbidding any other diffracted orders of the radiation in the exit pupil and
         interference fringes formed by interference between the pair of diffracted orders of the radiation, the interference fringes contributing to the definition of the first grating on the substrate.

40. A lithographic apparatus comprising:
   a patterning device configured to produce a first grating on a substrate by illuminating the patterning device with radiation, the patterning device comprising:
      an area with a phase-shift grating periodic in first and second directions and configured to produce in the exit pupil of the lithographic apparatus:
         an allowed diffracted first order of the radiation while forbidding diffraction of another first order and both second orders of the radiation in the exit pupil and
         interference fringes formed by interference between a zeroth order of the radiation and the allowed diffracted first order of the radiation, the interference fringes defining the second grating on the substrate.

41. A lithographic apparatus comprising:
   a patterning device configured to produce a first grating and a second grating on a substrate by illuminating the patterning device with radiation, the patterning device comprising:
      a first area with a first phase-shift grating periodic in first and second directions and configured to produce in the exit pupil of the lithographic apparatus:
         a pair of diffracted orders of the radiation other than the zeroth order, while forbidding any other diffracted orders of the radiation in the exit pupil and
         interference fringes formed by interference between the pair of diffracted orders of the radiation, the interference fringes contributing to the definition of the first grating on the substrate;
      a second area with a second phase-shift grating configured to produce in the exit pupil of the lithographic apparatus:
         an allowed diffracted first order of the radiation while forbidding diffraction of another first order and both second orders of the radiation in the exit pupil and
         interference fringes formed by interference between a zeroth order of the radiation and the allowed diffracted first order of the radiation, the interference fringes defining the second grating on the substrate.

* * * * *

UNITED STATES PATENT AND TRADEMARK OFFICE
CERTIFICATE OF CORRECTION

PATENT NO. : 9,201,311 B2
APPLICATION NO. : 13/533082
DATED : December 1, 2015
INVENTOR(S) : Coene et al.

Page 1 of 1

It is certified that error appears in the above-identified patent and that said Letters Patent is hereby corrected as shown below:

In the claims:

In column 24, line 27, claim 6, please delete "is".

Signed and Sealed this
Fifth Day of July, 2016

Michelle K. Lee
*Director of the United States Patent and Trademark Office*